United States Patent
Wang et al.

(10) Patent No.: US 9,588,198 B2
(45) Date of Patent: Mar. 7, 2017

(54) OPEN-TYPE NUCLEAR MAGNETIC RESONANCE MAGNET SYSTEM HAVING AN IRON RING MEMBER

(75) Inventors: Qiuliang Wang, Beijing (CN); Hui Wang, Beijing (CN); Xinning Hu, Beijing (CN); Yinming Dai, Beijing (CN); Luguang Yan, Beijing (CN); Jianyi Xu, Beijing (CN); Housheng Wang, Beijing (CN); Jianhua Wang, Beijing (CN)

(73) Assignee: INSTITUTE OF ELECTRICAL ENGINEERING CHINESE ACADEMY OF SCIENCES, Beijing (CN)

( * ) Notice: Subject to any disclaimer, the term of this patent is extended or adjusted under 35 U.S.C. 154(b) by 630 days.

(21) Appl. No.: 14/127,887

(22) PCT Filed: Dec. 14, 2011

(86) PCT No.: PCT/CN2011/083977
§ 371 (c)(1),
(2), (4) Date: Dec. 19, 2013

(87) PCT Pub. No.: WO2012/174834
PCT Pub. Date: Dec. 27, 2012

(65) Prior Publication Data
US 2014/0128267 A1    May 8, 2014

(30) Foreign Application Priority Data

Jun. 24, 2011 (CN) .......................... 2011 1 0171871

(51) Int. Cl.
*G01R 33/3815* (2006.01)
*G01R 33/3875* (2006.01)
(Continued)

(52) U.S. Cl.
CPC ... *G01R 33/34023* (2013.01); *G01R 33/3806* (2013.01); *G01R 33/3815* (2013.01); *G01R 33/3875* (2013.01); *G01R 33/421* (2013.01)

(58) Field of Classification Search
CPC .............. G01R 33/421; G01R 33/3875; G01R 33/3815; G01R 33/3806; G01R 33/34023
See application file for complete search history.

(56) References Cited

U.S. PATENT DOCUMENTS 6,150,912 A * 11/2000 Elgin, II .................. H01F 6/06
                                                          335/216
6,498,488 B2    12/2002 Takeshima et al.
(Continued)

FOREIGN PATENT DOCUMENTS

CN        101894652 A    6/2004
JP        2004-173722 A   12/2002

OTHER PUBLICATIONS

International Search Report for International Application No. PCT/CN2011/083977, mailed Mar. 22, 2012.

*Primary Examiner* — Gregory H Curran

(57) ABSTRACT

An open type nuclear magnetic resonance magnet system having an iron ring member. A superconducting coil and a superconducting switch form a closed-loop current circuit to generate a magnetic field. The generated magnetic field gains a magnetic flux circuit and executes magnetic field shielding through upper and lower iron yokes and a lateral iron yoke. The magnet system generates a desired magnetic field in a magnet imaging central area via the superconducting coil. To balance the extremely high electromagnetic force between the superconducting coil and the upper and lower iron yokes, an annular iron ring is mounted in a space defined by an inner perimeter wall of in a cryogenic container. The magnetic field distribution between the superconducting coil and the upper and lower iron yokes is (Continued)

changed via the iron ring, so that the electromagnetic interaction force therebetween is reduced.

19 Claims, 1 Drawing Sheet

(51) Int. Cl.
  *G01R 33/421* (2006.01)
  *G01R 33/38* (2006.01)
  *G01R 33/34* (2006.01)

(56) References Cited

U.S. PATENT DOCUMENTS

| | | | |
|---|---|---|---|
| 6,933,722 B2 * | 8/2005 | Tsuda | G01R 33/3806 324/318 |
| 2008/0024254 A1 * | 1/2008 | Chiba | G01R 33/3804 335/216 |
| 2010/0295640 A1 | 11/2010 | Tamura | |

* cited by examiner

OPEN-TYPE NUCLEAR MAGNETIC RESONANCE MAGNET SYSTEM HAVING AN IRON RING MEMBER

CROSS-REFERENCE TO RELATED APPLICATIONS

This application claims priority under 35 U.S.C. §371 to, and is a U.S. national phase application of, International Application No. PCT/CN2011/083977, filed Dec. 14, 2011, entitled "OPEN NUCLEAR MAGNETIC RESONANCE MAGNET SYSTEM HAVING IRON RING STRUCTURE," which claims priority to Chinese Application No. 201110171871.6, filed Jun. 24, 2011, the disclosures of each is incorporated herein by reference in their entirety.

TECHNICAL FIELD

The present disclosure relates to a magnetic system for a nuclear magnetic resonance imaging device.

BACKGROUND

A strong central magnetic field and a wide imaging space are desired for a medical nuclear magnetic resonance system. The strong central magnetic field may improve an imaging resolution. As compared with a cylindrical configuration, an open type magnet system formed by spaced super-conducting coils may provide patients with a magnetic field perpendicular to a sampling space, thereby having an imaging efficiency of $\sqrt{2}$ times higher than that of a parallel magnetic field. Thus, the perpendicular field has a higher imaging efficiency than the parallel field. On a main magnetic field is superposed a gradient magnetic field which changes over time which generates spatial codes of the imaging space. Further by means of stimulating of the sample realized by radio-frequency coils, clear diagnosing images can be provided for patients. Additionally, the magnet system composed of spaced super-conducting coils may provide a stronger magnetic field and a wider imaging area than a permanent magnet, as well as a space allowed for an on-line surgical treatment, and meanwhile the patients will not suffer from claustrophobia.

Presently, the medical nuclear magnetic resonance magnet system usually uses neodymium-iron-boron (NdFeB) permanent magnets, resistance magnets and superconducting magnets, etc. to generate the magnetic field. The magnetic field generated by common permanent magnets has an intensity of 0.5 T or below which is greatly influenced by environment temperatures. To stabilize the center magnetic field, a temperature controlling system is often used to ensure that the magnets have constant temperatures. The resistance magnes can provide a relatively high magnetic field, but has a considerable power consumptions, and moreover the magnetic field thereof has a poor stability which is influenced by a ripple factor of a power supply. With a development of new superconducting materials and cryogenic technology, superconducting magnets can be operated continuously for several years or more, through using non-volatile liquid helium immerging cooling.

A new type of magnet system is developed by replacing the permanent magnet system with a superconducting magnet system and using iron yokes for correcting the magnetic field, shielding the magnetic field, and providing a magnetic circuit. The resulting magnet system is lightweight and is relatively compact in structure. An electromagnetic force of up to dozens of tons may be generated between upper/lower iron yokes and the symmetrical distributing superconducting coils due to interactions therebetween, which tends to cause the coils to be instable. Thus, a strong external supporting means is required in order to eliminate the instability of coils. The strong external supporting means tends to deform at a cryogenic condition, which in turn causes deformations of the coils, even breakage of the coil structures, thereby causing "a quench phenomenon". On the other hand, the external supporting means is large in volume and is complex in structure, such that the whole magnet system is complex in structure. Finally, heat will flow from the external supporting means into the cryogenic system, such that liquid helium consumption is relatively high.

SUMMARY

To overcome the above-mentioned drawbacks of the external supporting means of the present nuclear magnetic resonance magnets, such as a large volume and a complex structure, the present disclosure proposes an open type nuclear magnetic resonance magnet system having an iron ring member. Additionally, the present disclosure may substantially completely offset the relatively strong electromagnetic interaction force between the superconducting coils and iron yokes.

The present disclosure utilizes low or high temperature superconducting wires as a magnetic generating source, and uses ferromagnetic iron yokes to form a magnetic circuit for the magnetic flux generated by the superconducting coils and to shield magnetic field.

The open type nuclear magnetic resonance magnet system according to the present disclosure includes an upper portion and a lower portion. The upper and lower portions have the same structure and are symmetrical about an imaging central point of the magnet system. Each of the upper and lower portions comprises an annular superconducting coil and a cryogenic container within which the superconducting coil is placed to be subjected to a cryogenic environment so as to achieve superconducting. The cryogenic containers of both the upper and lower portions are communicated via a cryogenic container interconnection tube. A superconducting switch and the superconducting coil constitute a closed-loop current circuit to generate magnetic field. A magnetic flux circuit is formed for magnetic field generated by the superconducting coil, through upper and lower iron yokes and a lateral iron yoke, and meanwhile the magnetic field is shielded. The upper and lower iron yokes and the lateral iron yoke made of ferromagnetic materials are magnetized by the magnetic field generated by the superconducting coil. The magnet system generates a desired magnetic field in a magnet imaging central area by means of the superconducting coils. To offset a huge electromagnetic interaction force between each superconducting coil and the corresponding one of the upper and lower iron yokes, the present disclosure proposes to mount a cylindrical iron ring in a space defined by an inner perimeter wall of each cryogenic container. The iron ring is configured to change a magnetic field distribution between the superconducting coil and the corresponding one of the upper and lower iron yokes to thus reduce the electromagnetic interaction force between the superconducting coil and the corresponding one of the upper and lower iron yokes. The iron ring is supported by an iron ring supporting member made from non-ferromagnetic materials. An epoxy resin backing plate is interposed between each iron ring supporting member and the respective upper/lower iron yokes to ensure an electric insulation between the iron ring supporting member and the upper/lower iron yokes.

Within a space defined by an inner wall of the iron ring supporting member are arranged a gradient coil and a shim coil. The shim coil is closer to the magnet imaging central area in the axial direction than the gradient coil. The gradient coils and shim coils for both the upper and lower iron ring supporting members are symmetric with respect to the central area. The gradient coil is configured to generate a gradient field, and the shim coil is configured to calibrate the magnetic field distribution in the imaging space. To shield a vortex generated by the gradient coil during its shifting process, the present disclosure uses a shield coil placed radially outside the gradient coil coaxially. The shield coil and the gradient coil are supported by epoxy resin supporting plates.

According to the present disclosure, the iron ring in the space defined by the inner perimeter wall of each cryogenic container is comprised of annular iron laminations. The iron ring has its outer perimeter approaching to the inner surface of the cryogenic container. Materials for the iron ring may be carton steel or other materials with a high magnetic conductivity, to reduce the required quantity of the materials. The iron ring has its thickness and height designed to try to completely offset the electromagnetic attractive force between the superconducting coils and the upper and lower iron yokes. That is, the thickness and height of the iron ring are controlled to try to completely offset the electromagnetic attractive force between the superconducting coils and the upper and lower iron yokes. Each of the iron laminations constituting the iron ring has a weight as low as possible, and each iron lamination may have a thickness of about 1-2 mm. The electromagnetic attractive force between the superconducting coils and the upper and lower iron yokes may be substantially completely offset in practice through increasing or reducing the amount of the iron laminations. Thus an electromagnetic force balance may be achieved.

There is no magnetic circuit, provided by ferromagnetic materials, between each iron ring and the corresponding one of the upper and lower iron yokes, and a magnetic resistance is created between the iron ring and the respective iron yoke by means of an air gap therebetween. Thus, an interaction force may be generated between the superconducting coil and the iron ring magnetized by the superconducting coil which offsets at least a portion of the electromagnetic force between the superconducting coil and the corresponding one of the upper and lower iron yokes.

Said iron rings are secured (mechanically fixed) to the symmetrical iron yokes through members of non-ferromagnetic materials. Meanwhile, by forming the iron ring as a laminated structure, the interaction force may be easily adjusted by adjusting the thickness of the iron ring via increasing or reducing the amount of the iron laminations. Thus, the interaction force between the coils and the iron yokes may be reduced.

To eliminate vortex, the iron ring of the open type nuclear magnetic resonance magnet system according to the present disclosure has slits formed therein to reduce the vortex due to the magnetic field change of the gradient coil.

DETAILED DESCRIPTION

The present disclosure is further described below in connection with accompanying drawings and preferred embodiments.

Figure 1:
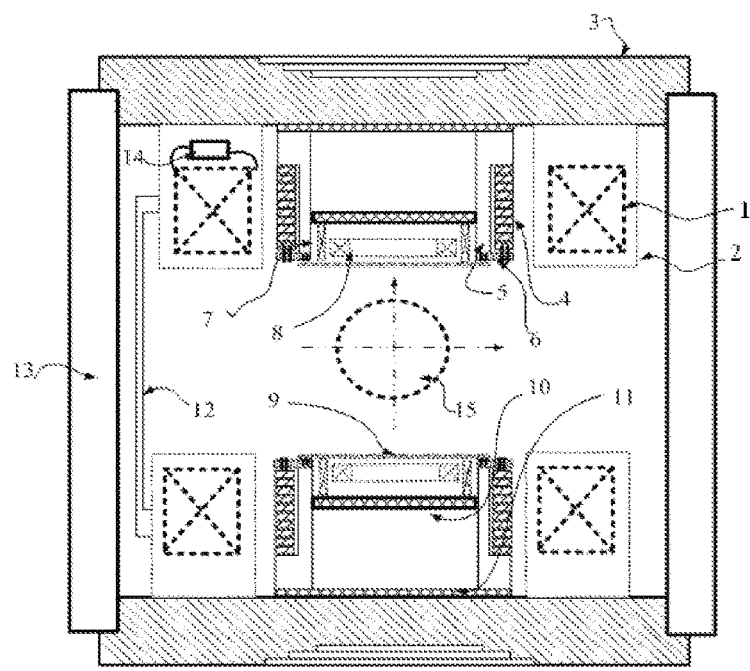
FIG. 1 is a schematic view of an exemplary embodiment of an open type magnet system according to the present disclosure.

As shown in FIG. 1, an open type nuclear magnetic resonance (NMR) magnet system according to the present disclosure includes an upper portion and a lower portion; the upper and lower portions have identical structures and are symmetrical about an imaging central point of the magnet system. Each of the upper and lower portions comprises an annular superconducting coil 1 and a cryogenic container 2. The superconducting coil 1 is placed inside the cryogenic container 2 to be subjected to a cryogenic environment. A cryogenic container interconnection tube 12 connects the upper and lower temperature containers 2. The superconducting coil 1 and a superconducting switch 14 constitute a closed-loop electrical current circuit for producing magnetic field. By means of the generated magnetic field, a magnetic flux circuit is formed through upper and lower iron yokes 3 and a lateral iron yoke 13, and meanwhile a magnetic field shielding is obtained. The upper and lower iron yokes 3 and the lateral iron yoke 13 made from ferromagnetic materials are magnetized by the magnetic field generated by the superconducting coil 1. The magnet system generates a desired magnetic field in an imaging central area 15 thereof through the superconducting coil 1.

To balance an extremely high electromagnetic interaction force between the superconducting coil 1 and upper and lower iron yokes 3, an annular iron ring 4 is mounted within an inner hollow volume of each cryogenic container 2. The iron ring 4 is arranged to change a magnetic field distribution between each superconducting coil 1 and the corresponding one of the upper and lower iron yokes 3, to in turn offset the electromagnetic interaction force therebetween. The iron ring 4 is secured to an iron ring supporting member 5 made from non-ferromagnetic materials. A backing plate 11 which for example is made from non-ferromagnetic materials, such as epoxy resin, is interposed between each iron ring supporting member 5 and a corresponding one of the upper and lower iron yokes 3, to thus ensure an electric insulation between the iron ring supporting members 5 and the upper and lower iron yokes 3. A gradient coil 8 and a shim coil 9 are in sequence disposed in a spaced defined by an inner wall of each iron ring supporting member 5, being centrosymmetric with respect to the corresponding two coils in the opposite supporting member 5. Along an axial direction, the shim coil 9 than the gradient coil 8 is closer to the imaging central area. The gradient coil 8 functions to generate a gradient field, the shim coil 9 mainly functions to calibrate magnetic field distribution of the imaging space. To shield a vortex generated during a switching operation of the gradient coil 8, a shield coil 7 is used in the present disclosure and coaxially placed outside the gradient coil 8. The shield coil 7 and the gradient coil 8 are supported by an epoxy resin supporting plate 10.

Figure 2:
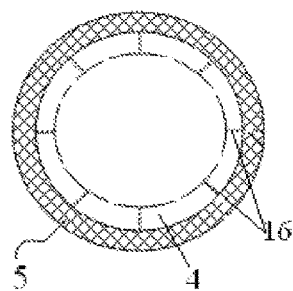
FIG. 2 is a schematic view of an exemplary embodiment of the iron ring and the iron ring supporting member.

FIG. 2 is a top view of the iron ring 4 and the iron ring supporting member 5. In view that a lower portion of the iron ring 4 is adjacent to the gradient coil 8, slits 16 are radially cut out within the iron ring 4 to reduce a vortex due to a change of the magnetic field of the gradient coil 8.

Figure 3:
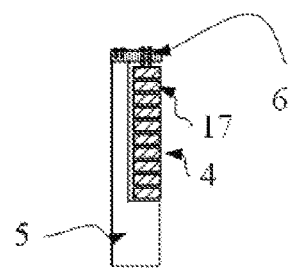
FIG. 3 is a schematic view of the iron ring member.

As shown in FIG. 3, the iron ring 4 is comprised of a plurality of annular iron laminations; each iron lamination has a thickness of about 1-2 mm and may be made from carbon steel or other materials having a high magnetic conductivity. Both iron rings are respectively fixed to the symmetrical iron yokes by means of the iron ring supporting members 5 made from the non-ferromagnetic materials. Forming the iron ring 4 as a laminated member will facilitate adjustments. That is, by increasing or reducing the amount of the iron laminations 17, the iron ring 4 may be adjusted in terms of thickness, so that the electromagnetic attractive force between the superconducting coil 1 and the upper and lower iron yokes 3 may be completely offset to about zero, thereby achieving a desired force balance. Once the amount of the iron laminations 17 has been adapted to a desired force balance, an iron ring securing member 6 may fix the iron laminations 17 together so as to obtain a stabilized iron ring member.

LIST OF REFERENCE NUMBERS

1 superconducting coil
2 cryogenic container
3 iron yokes
4 iron ring
5 iron ring supporting member
6 iron ring securing member
7 shield coil
8 gradient coil
9 shim coil
10 epoxy resin supporting plate
11 epoxy resin backing plate
12 cryogenic container interconnection tube
13 lateral iron yoke
14 superconducting switch
15 magnet imaging central area
16 slit in the iron ring

The invention claimed is:

1. An open type nuclear magnetic resonance magnet system having an iron ring member, the magnet system comprising:
  an upper portion and a lower portion; the upper and lower portions having the same structure and being symmetrical about an imaging central point of the magnet system; each of the upper and lower portions comprising an annular superconducting coil and a cryogenic container within which the superconducting coil is placed to be subjected to a cryogenic environment so as to achieve superconducting, wherein:
  the upper portion further includes an upper iron yoke associated with its superconducting coil, the lower portion also includes a lower iron yoke associated with its superconducting coil, and a lateral iron yoke is disposed between the upper and lower iron yokes, so that a magnetic flux circuit is formed for magnetic field generated by the superconducting coil in operation, through the upper and lower iron yokes and the lateral iron yoke and meanwhile the magnetic field is shielded; the upper and lower iron yokes and the lateral iron yoke being configured to be magnetized by the magnetic field generated by the superconducting coil, the superconducting coil generating a desired magnetic field in a magnet imaging central area;
  the system further includes a cylindrical iron ring mounted in a space defined by an inner perimeter wall of each cryogenic container, and an iron ring supporting member made from non-ferromagnetic materials and supporting the iron ring; the iron ring is configured to change a magnetic field distribution between the superconducting coil and the corresponding one of the upper and lower iron yokes to thus reduce or completely offset an electromagnetic interaction force between the superconducting coil and the corresponding one of the upper and lower iron yokes; each iron ring supporting member being connected to a respective one of the upper and lower iron yokes;
  the iron ring is comprised of cylindrical iron laminations; and an outer perimeter of the iron ring approaches to an inner side perimeter wall of the cryogenic container.

2. The open type nuclear magnetic resonance magnet system according to claim 1, wherein there is no magnetic circuit, provided by ferromagnetic materials, between each iron ring and the corresponding one of the upper and lower iron yokes, and a magnetic resistance is created between the iron ring and the respective iron yoke by means of an air gap therebetween; and an interaction force is generated between the superconducting coil and the iron ring magnetized by the superconducting coil which offsets at least a portion of the electromagnetic force between the superconducting coil and the corresponding one of the upper and lower iron yokes.

3. The open type nuclear magnetic resonance magnet system according to claim 1, wherein, the iron ring is made of ferromagnetic materials and has a thickness and a height such that the electromagnetic attractive force between the superconducting coil and the corresponding one of the upper and lower iron yokes is offset to about zero.

4. The open type nuclear magnetic resonance magnet system according to claim 1, wherein, the electromagnetic force between the superconducting coil and the corresponding one of the upper and lower iron yokes is adjustable by adjusting the thickness of the iron ring via increasing or reducing the amount of the iron laminations.

5. The open type nuclear magnetic resonance magnet system according to claim 1, wherein, each iron lamination has a thickness of 1-2 mm.

6. The open type nuclear magnetic resonance magnet system according to claim 1, wherein, a backing plate is placed between each iron supporting member and the corresponding one of the upper and lower iron yokes.

7. The open type nuclear magnetic resonance magnet system according to claim 1, wherein, the cryogenic containers of both the upper and lower portions are communicated via a cryogenic container interconnection tube.

8. An open type nuclear magnetic resonance magnet system, comprising:
  an upper portion and a lower portion; the upper and lower portions having the same structure and being symmetrical about an imaging central point of the magnet system; each of the upper and lower portions comprising an annular superconducting coil and a cryogenic container within which the superconducting coil is placed to be subjected to a cryogenic environment so as to achieve superconducting, wherein:
  the upper portion further includes an upper iron yoke associated with its superconducting coil, the lower portion also includes a lower iron yoke associated with its superconducting coil, and a lateral iron yoke is disposed between the upper and lower iron yokes, so that a magnetic flux circuit is formed for magnetic field generated by the superconducting coil in operation, through the upper and lower iron yokes and the lateral iron yoke and meanwhile the magnetic field is shielded; the upper and lower iron yokes and the lateral iron yoke being configured to be magnetized by the magnetic superconducting coil, the superconducting coil generating a desired magnetic field in a magnet imaging central area;

the system further includes a cylindrical iron ring mounted in a space defined by an inner perimeter wall of each cryogenic container, and an iron ring supporting member made from non-ferromagnetic materials and supporting the iron ring; the iron ring is configured to change a magnetic field distribution between the superconducting coil and the corresponding one of the upper and lower iron yokes to thus reduce or completely offset an electromagnetic interaction force between the superconducting coil and the corresponding one of the upper and lower iron yokes; each iron ring supporting member being connected to a respective one of the upper and lower iron yokes;

within a space defined by an inner wall of the iron ring supporting member are arranged a gradient coil and a shim coil, the shim coil being closer to the magnet imaging central area in the axial direction than the gradient coil; and a shield coil is placed radially outside the gradient coil coaxially; and the gradient coils and shim coils for both the upper and lower iron ring supporting members are symmetric with respect to the central area.

9. The open type nuclear magnetic resonance magnet system according to claim 8, wherein there is no magnetic circuit, provided by ferromagnetic materials, between each iron ring and the corresponding one of the upper and lower iron yokes, and a magnetic resistance is created between the iron ring and the respective iron yoke by means of an air gap therebetween;

and an interaction force is generated between the superconducting coil and the iron ring magnetized by the superconducting coil which offsets at least a portion of the electromagnetic force between the superconducting coil and the corresponding one of the upper and lower iron yokes.

10. The open type nuclear magnetic resonance magnet system according to claim 8, wherein, the iron ring is comprised of cylindrical iron laminations; and an outer perimeter of the iron ring approaches to an inner side perimeter wall of the cryogenic container.

11. The open type nuclear magnetic resonance magnet system according to claim 8, wherein, the iron ring is made of ferromagnetic materials and has a thickness and a height such that the electromagnetic attractive force between the superconducting coil and the corresponding one of the upper and lower iron yokes is offset to about zero.

12. The open type nuclear magnetic resonance magnet system according to claim 8, wherein, a backing plate is placed between each iron supporting member and the corresponding one of the upper and lower iron yokes.

13. The open type nuclear magnetic resonance magnet system according to claim 8, wherein, the cryogenic containers of both the upper and lower portions are communicated via a cryogenic container interconnection tube.

14. An The open type nuclear magnetic resonance magnet system, comprising:

an upper portion and a lower portion; the upper and lower portions having the same structure and being symmetrical about an imaging central point of the magnet system; each of the upper and lower portions comprising an annular superconducting coil and a cryogenic container within which the superconducting coil is placed to a cryogenic environment so as to achieve superconducting, wherein:

the upper portion further includes an upper iron yoke associated with its superconducting coil, the lower portion also includes a lower iron yoke associated with its superconducting coil, and a lateral iron yoke is disposed between the upper and lower iron yokes, so that a magnetic flux circuit is formed for magnetic field generated by the superconducting coil in operation, through iron yokes and the lateral iron yoke and meanwhile the magnetic field is shielded; the upper and lower iron yokes and the lateral iron yoke being configured to be magnetized by the magnetic field generated by the superconducting coil, the superconducting coil generating a desired magnetic field in a magnet imaging central area;

the system further includes a cylindrical iron ring mounted in a space defined by an inner perimeter wall of each cryogenic container, and an iron ring supporting member made from non-ferromagnetic materials and supporting the iron ring; the iron ring is configured to change a magnetic field distribution between the superconducting coil and the corresponding one of the upper and lower iron yokes to thus reduce or completely offset an electromagnetic interaction force between the superconducting coil and the corresponding one of the upper and lower iron yokes; each iron ring supporting member being connected to a respective one of the upper and lower iron yokes;

slits are cut out in a radial direction within the iron ring to reduce vortex generated due to a change in the magnetic field of the gradient coil.

15. The open type nuclear magnetic resonance magnet system according to claim 14, wherein there is no magnetic circuit, provided by ferromagnetic materials, between each iron ring and the corresponding one of the upper and lower iron yokes, and a magnetic resistance is created between the iron ring and the respective iron yoke by means of an air gap therebetween; and an interaction force is generated between the superconducting coil and the iron ring magnetized by the superconducting coil which offsets at least a portion of the electromagnetic force between the superconducting coil and the corresponding one of the upper and lower iron yokes.

16. The open type nuclear magnetic resonance magnet system according to claim 14, wherein, the iron ring is comprised of cylindrical iron laminations; and an outer perimeter of the iron ring approaches to an inner side perimeter wall of the cryogenic container.

17. The open type nuclear magnetic resonance magnet system according to claim 14, wherein, the iron ring is made of ferromagnetic materials and has a thickness and a height such that the electromagnetic attractive force between the superconducting coil and the corresponding one of the upper and lower iron yokes is offset to about zero.

18. The open type nuclear magnetic resonance magnet system according to claim 14, wherein, a backing plate is placed between each iron supporting member and the corresponding one of the upper and lower iron yokes.

19. The open type nuclear magnetic resonance magnet system according to claim 14, wherein, the cryogenic containers of both the upper and lower portions are communicated via a cryogenic container interconnection tube.

* * * * *

UNITED STATES PATENT AND TRADEMARK OFFICE
CERTIFICATE OF CORRECTION

| | |
|---|---|
| PATENT NO. | : 9,588,198 B2 |
| APPLICATION NO. | : 14/127887 |
| DATED | : March 7, 2017 |
| INVENTOR(S) | : Qiuliang Wang et al. |

It is certified that error appears in the above-identified patent and that said Letters Patent is hereby corrected as shown below:

In the Claims

Column 7, Line 1 (Claim 8, Line 22):
Add "field generated by the" before --superconducting coil--

Column 7, Line 58 (Claim 14, Line 1):
Delete "The" after --An--

Column 8, Line 2 (Claim 14, Line 9):
"placed to a cryogenic" should be --placed to be subjected to a cryogenic--

Column 8, Line 11 (Claim 14, Line 18):
"through iron yokes" should be --through the upper and lower iron yokes--

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*